United States Patent
Turner et al.

(10) Patent No.: US 10,857,773 B2
(45) Date of Patent: Dec. 8, 2020

(54) SYSTEM FOR TRANSFER OF NANOMEMBRANE ELEMENTS WITH IMPROVED PRESERVATION OF SPATIAL INTEGRITY

(71) Applicant: Wisconsin Alumni Research Foundation, Madison, WI (US)

(72) Inventors: Kevin Thomas Turner, Wayne, PA (US); David Scott Grierson, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 643 days.

(21) Appl. No.: 14/794,232

(22) Filed: Jul. 8, 2015

(65) Prior Publication Data

US 2015/0375488 A1    Dec. 31, 2015

Related U.S. Application Data

(62) Division of application No. 13/530,961, filed on Jun. 22, 2012, now Pat. No. 9,079,351.

(51) Int. Cl.
| | |
|---|---|
| *B32B 37/00* | (2006.01) |
| *B32B 38/10* | (2006.01) |
| *B81C 99/00* | (2010.01) |
| *B29C 59/02* | (2006.01) |
| *B32B 38/06* | (2006.01) |
| *B32B 38/18* | (2006.01) |
| *B32B 38/00* | (2006.01) |
| *B32B 41/00* | (2006.01) |

(Continued)

(52) U.S. Cl.
CPC .......... *B32B 37/025* (2013.01); *B29C 59/026* (2013.01); *B32B 37/0053* (2013.01); *B32B 38/06* (2013.01); *B32B 38/10* (2013.01); *B32B 38/1825* (2013.01); *B32B 38/1875* (2013.01); *B32B 41/00* (2013.01); *B81C 99/002* (2013.01); *B29K 2067/00* (2013.01); *B29K 2079/08* (2013.01); *B29L 2031/755* (2013.01); *B32B 2367/00* (2013.01); *B32B 2379/08* (2013.01); *Y10T 156/1195* (2015.01)

(58) Field of Classification Search
CPC ........... H01L 21/67132; H01L 21/6836; B32B 37/025; B32B 37/0053
See application file for complete search history.

(56) References Cited

U.S. PATENT DOCUMENTS

| | | | | |
|---|---|---|---|---|
| 2005/0282362 A1* | 12/2005 | Kobayashi | ........ | H01L 21/67132 438/464 |
| 2007/0077730 A1* | 4/2007 | Halope | ............ | G06K 19/07718 438/455 |

(Continued)

OTHER PUBLICATIONS

Semprius—Massively Parallel Pick and Place: A Closer Look, I-Micronews, the Disruptive Semiconductor Technologies Website, www.i-micronews.com, Jun. 24, 2011, Yole Developpement.

*Primary Examiner* — Philip C Tucker
*Assistant Examiner* — John Blades
(74) *Attorney, Agent, or Firm* — Boyle Fredrickson S.C.

(57) ABSTRACT

Transfer of nanoscale elements from a substrate on which they were manufactured or transferred to a flexible sheet may be performed by local and progressive deformation of the flexible sheet over the surface of the substrate to attach and lift the nanoscale elements from the substrate with controlled inter-element registration.

19 Claims, 6 Drawing Sheets

(51) Int. Cl.
   *B29K 67/00*   (2006.01)
   *B29K 79/00*   (2006.01)
   *B29L 31/00*   (2006.01)

(56) References Cited

U.S. PATENT DOCUMENTS

| | | | |
|---|---|---|---|
| 2007/0131344 A1* | 6/2007 | Tsujimoto | H01L 21/67132 156/248 |
| 2007/0295437 A1* | 12/2007 | Lee | B32B 37/0046 156/60 |
| 2012/0118506 A1* | 5/2012 | Kim | H01L 21/6836 156/367 |

* cited by examiner

SYSTEM FOR TRANSFER OF NANOMEMBRANE ELEMENTS WITH IMPROVED PRESERVATION OF SPATIAL INTEGRITY

CROSS REFERENCE TO RELATED APPLICATION

This application is a divisional of application Ser. No. 13/530,961 filed Jun. 22, 2012 and hereby incorporated by reference.

STATEMENT REGARDING FEDERALLY SPONSORED RESEARCH OR DEVELOPMENT

This invention was made with government support under FA9550-08-1-0337 awarded by USAF/AFOSR. The government has certain rights in the invention.

BACKGROUND OF THE INVENTION

The present invention relates to deterministic assembly techniques for nanoscale elements and in particular to a method and apparatus for transferring large areas of nanoscale elements from relatively rigid substrates to flexible materials while controlling precise inter-element spacing and avoiding mechanical damage to the nanoscale elements.

Integrated circuit techniques providing microscale deposition, patterning and etching on a substrate at microscale and nanoscale dimensions, for example, using photo, e-beam, or nanoimprint lithography, can be used to produce a variety of electrical, mechanical, and photonic elements having nanoscale dimensions. These elements are most conveniently fabricated on a stiff substrate, for example, of a crystalline silicon wafer.

Current wafer sizes are limited to approximately 12 inches, a limit representing the difficulties of growing large silicon crystals and limitations to the effective processing area of integrated circuit equipment. While such wafer sizes are adequate for standalone integrated circuit electronics, it may be desired to produce an array of fabricated nanoscale elements extending over a substantially larger area with precisely controlled spacing, for example, for optical or radio-frequency arrays. In addition, it may be desired to transfer the nanoscale elements from the relatively rigid and brittle wafer, for example, to a flexible material amenable to more applications and manufacturing processes.

Precise transfer of nanoscale elements from the substrate on which they were manufactured to another surface can be a difficult manufacturing challenge. Typically, this challenge is addressed by pick-and-place techniques, for example, using a machine to pick up the nanoscale elements from the manufacturing substrate using a transfer plate on a mechanical arm and place them in the desired location with high accuracy on a second surface.

SUMMARY OF THE INVENTION

The present inventors have developed a precise and rapid method of transferring nanoscale elements from a manufacturing substrate to a flexible substrate by locally pressing a flexible substrate into contact with the manufacturing substrate and progressively moving the area of contact across the manufacturing substrate. The method may provide both a single-step transfer and potentially a substantially continuous and parallel transfer operation.

In one specific embodiment, the present invention provides a method of generating a large-scale array of nano-patterned elements on a flexible substrate starting with a substrate having nano-patterned elements arrayed on its surface. The substrate containing the nano-patterned elements is overlaid with a flexible sheet. The flexible sheet is then locally deformed to establish intimate contact between the flexible sheet and a selected subset of the nano-patterned elements to cause preferential adhesion thereto in the area of the contact. The location of the deformation is then changed to lift the first subset of nano-patterned elements from the substrate and to deform the flexible sheet into intimate contact with a different second subset of nano-patterned elements to cause preferential adhesion thereto in the area of contact. The steps are then repeated with different subsets of the nano-patterned elements.

It is thus a feature of at least one embodiment of the invention to provide a process that eliminates a two-step pick-and-place operation which can introduce position errors. It is a feature of at least one embodiment of the invention to provide a transfer process that may further work in parallel to move multiple selected elements at a given time.

The nano-patterned elements may have a thickness measured perpendicular to a plane of the substrate on the nanometer scale (less than 1000 nm).

It is thus a feature of at least one embodiment of the invention to provide a transfer method particularly suitable for thin membrane elements.

The nano-patterned elements may have a lateral dimension measured parallel to a plane of the substrate of less than 1000 micrometers.

It is thus a feature of at least one embodiment of the invention to provide a transfer method suitable for elements with small lateral dimensions that would be difficult to pick up using dimensionally matched pick-and-place processes.

The deformation may be applied by a compressing a movable element against the outer surface of the flexible sheet.

It is thus a feature of at least one embodiment of the invention to provide a transfer method that does not require direct contact with the nano-patterned elements.

The flexible sheet may be substantially dimensionally stable in directions parallel to the surface of the flexible sheet at the scale of the nano-patterned elements.

It is thus a feature of at least one embodiment of the invention to provide a system that may accurately preserve a desired dimensional separation between nano-patterned elements that are arranged in an array or the like.

The flexible sheet may be a polymeric material.

It is thus a feature of at least one embodiment of the invention to provide a system suitable for transferring nano-patterned elements to a range of commonly available and useful flexible substrates.

The polymeric material may be a polymer belonging to the polyester or polyimide families.

It is thus a feature of at least one embodiment of the invention to provide a polymeric material with flexibility and high lateral dimensional stability.

The flexible sheet may be subject to in-plane tension during the transfer process.

It is thus a feature of at least one embodiment of the invention to control a lifting upward of the nanoscale elements with a load-bearing flexible sheet.

The flexible sheet may be coated with an adhesive material on a side facing the nano-patterned elements.

It is thus a feature of at least one embodiment of the invention to provide a method of tailoring the relative adhesion between the nano-patterned elements and substrate and between nano-patterned elements and the flexible sheet. It is a feature of at least one embodiment of the invention to permit control of the degree of permanence of the adhesion of the nanoscale elements to the flexible sheet.

The adhesive may be a pressure-sensitive adhesive.

It is thus a feature of at least one embodiment of the invention to provide an adhesive with properties augmenting the transfer technique which controls a local pressure of contact.

The adhesive may be an ultraviolet curing adhesive, and the method may include the step of exposing the adhesive to ultraviolet light to control the surface tack prior to forming the flexible sheet into intimate contact with the nano-patterned elements.

It is thus a feature of at least one embodiment of the invention to provide precise and immediate control of the tack of the adhesive.

The method may include the step of physically separating the nano-patterned elements from the substrate to be releasably retained by the substrate before transfer.

It is thus a feature of at least one embodiment of the invention to employ a natural adhesion between the substrate and the nano-patterned elements to preserve registration before the transfer.

The method may include the steps of applying an interconnecting supporting material to the nano-patterned elements prior to separation from the substrate and removing the interconnecting supporting material after the nano patterned elements are releasably adhered to the substrate and before transfer to the flexible sheet.

It is thus a feature of at least one embodiment of the invention to stabilize the nano-patterned elements in a matrix material during separation from the common substrate to preserve registration before the transfer.

The supporting material may be a polymer material removed by dissolving or by physical separation before the transfer to the flexible substrate.

It is thus a feature of at least one embodiment of the invention to better resist displacement of the nano-patterned elements during their separation from the common substrate.

The nano-patterned elements may alternatively be attached to the substrate by frangible tabs that are broken when the flexible sheet lifts the nano-patterned elements from the substrate.

It is thus a feature of at least one embodiment of the invention to permit physical attachment to the common substrate to maintain proper registration before transfer to the flexible sheet.

The method may include the step of repositioning the flexible sheet with respect to the substrate in between steps of changing the location of the deformation.

It is thus a feature of at least one embodiment of the invention to provide for precise transfer of nano-patterned elements from a common substrate to a flexible sheet while allowing the separation between the nano-patterned elements to be changed.

These particular objects and advantages may apply to only some embodiments falling within the claims and thus do not define the scope of the invention.

DETAILED DESCRIPTION OF THE PREFERRED EMBODIMENT

Figure 1:
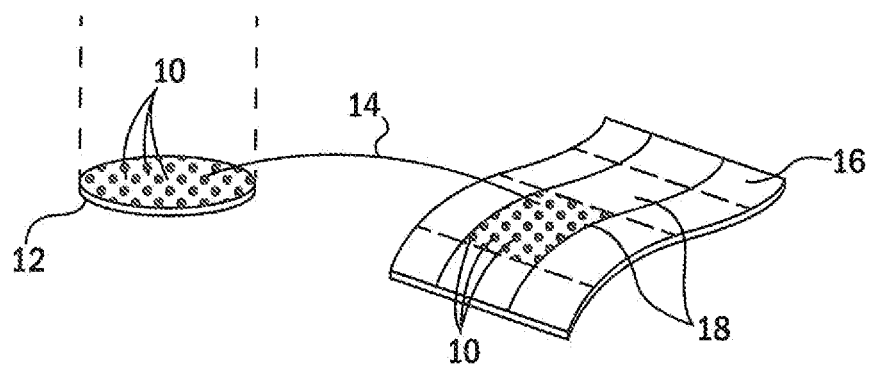
FIG. 1 is a simplified representation of a common substrate on which nano-patterned elements may be fabricated and a flexible substrate to which they may be transferred per the present invention.

Referring now to FIG. 1, a plurality of nano-patterned elements 10 may be fabricated on a common substrate 12, for example, a six-inch diameter silicon on insulator (SOI) silicon wafer. The nano-patterned elements 10 may be fabricated from the upper silicon layer which may be doped, metallized and etched away to provide the nano-patterned elements 10 completely or partially released from the remainder of the common substrate 12.

The nano-patterned elements 10 in a released state may have a thickness ranging from the micrometer scale down to the nanometer scale (less than 1000 nanometers) measured perpendicular to the upper plane of the substrate 12 and may have a lateral dimension measured along the substrate of 1000 micrometers or less and possibly 500 micrometers or less. Thicknesses from tens of nanometers to micrometers and lateral dimensions from hundreds of microns to hundreds of nanometers are contemplated. Generally, the nano-patterned elements will include features having at least one dimension of less than 1000 nm.

As will be discussed in more detail below, the nano-patterned elements 10 may be fabricated by any of a variety of techniques that provide for a fixed spacing on a surface. The nano-patterned elements 10 may be manufactured using well-known integrated circuit techniques including but not limited to: photolithography, electron- or ion-beam writing, or nanoimprint lithography, and the like, followed by chemical or plasma etching and the like. The nano-patterned elements 10 may include both conducting, semiconducting, and dielectric materials as is understood in the art to provide for electrical, mechanical, photonic devices (such as waveguides, resonators), and optical elements such as gratings and the like. The nano-patterned elements 10 may have features with sub-optical-wavelength dimensions (e.g. dimensions less than a wavelength of a light frequency).

The present invention provides a transfer 14 of the nano-patterned elements 10 exposed on the upper surface of the substrate 12 to a corresponding surface of a flexible sheet 16 having a much larger area than the common substrate 12, for example, 0.1 m² and larger. Multiple transfers 14 may be performed to transfer adjacent tiles 18 of nano-patterned elements 10 from multiple different substrates 12 to a single flexible sheet 16.

Figure 2:
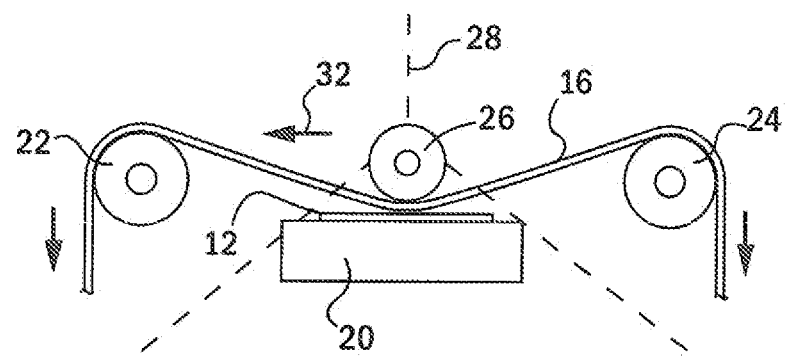
FIG. 2 is a schematic representation of an apparatus providing the transfer of FIG. 1 by selected deformation of a flexible sheet positioned above nano-patterned elements that are releasably attached to the common substrate.
Figure 2:
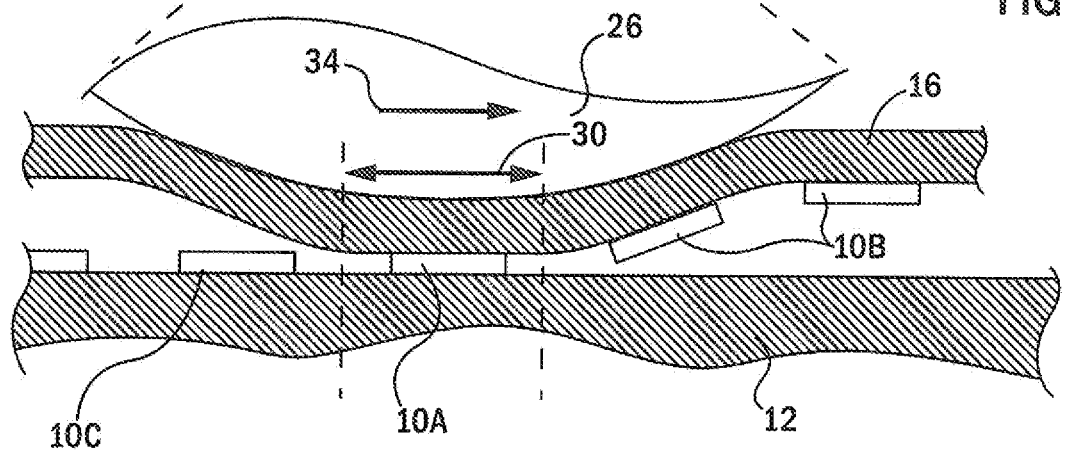

Referring now to FIG. 2, in a simplified embodiment, the common substrate 12 may be supported from below on a generally horizontal base plate 20 so that the upper surface of the common substrate 12 exposes the nano-patterned elements 10 such as may be fabricated on the common substrate 12 and releasably retained in place thereon. The substrate 12 may be attached to the base plate 20, for example, with a mechanical clamp, vacuum chuck, double-stick tape or other similar means.

A flexible sheet 16 is then positioned to overlie the substrate 12, for example, as held in tension between upstream and downstream rollers 22 and 24 respectively applying a predetermined tension to the substantially horizontal flexible sheet 16.

A deformation roller 26 positioned above the flexible sheet 16 may be pressed downward along a deformation axis 28 in a direction generally normal to the surface of the substrate 12. The deformation roller 26 presses against an upper surface of the flexible sheet 16 opposite the surface facing the nanoscale pattern elements 10 to deform the flexible sheet 16 so that it compresses the nano-patterned elements 10*a* between the flexible sheet 16 and the upper surface of the substrate 12 substantially only within a footprint area 30 covering a small portion of the surface of the substrate 12. The base plate 20 supports the substrate 12 against downward movement under the force of the deformation roller 26.

The relative adhesion between the nano-patterned elements 10 and the under surface of the flexible sheet 16 is such that the nano-patterned element 10*a* preferentially adheres to the flexible sheet 16. This differential adhesion property may be augmented by an adhesive material attached to the under surface of the flexible sheet 16 as will be described below.

The tension and natural resilience of the flexible substrate 12 causes it to pull away from the substrate 12 on either side of the footprint area 30. For this reason, as deformation roller 26 is advanced in advance direction 32, downstream nano-patterned elements 10*b* will be lifted away from the substrate 12 as attached to the under surface of the flexible sheet 16 and upstream nano-patterned elements 10*c* will remain adhered in position to the substrate 12 having not yet contacted flexible sheet 16. The deformation roller 26 may roll as indicated by arrow 34 about an axis generally perpendicular to advance direction 32 and parallel to the plane of the substrate 12.

It will be appreciated that the flexible sheet 16 may deform without substantial stretching along the direction between the rollers 22 and 24 because of the relatively small amounts of deflection required to bring the flexible sheet 16 into contact with the upper surfaces of the nano-patterned elements 10 and the inherent in-plane dimensional stability of the flexible sheet. Generally, the elastic stretching of the flexible sheet 16 in a direction perpendicular to the axis of deformation axis 28 will be less than 1/10 and preferably less than 1/100 of the separation between the nanoscale elements 10 during its deformation. A variety of different materials for the flexible sheet 16 may be employed, including polymeric films such as polyethylene terephthalate (PET), polyimide, and the like. Importantly, the dimensional stability of the flexible sheet not only preserves spatial arrangement and integrity but also prevents fracture or breaking of the nanomembranes during transfer by limiting the strains in the transferred components.

Figure 3:
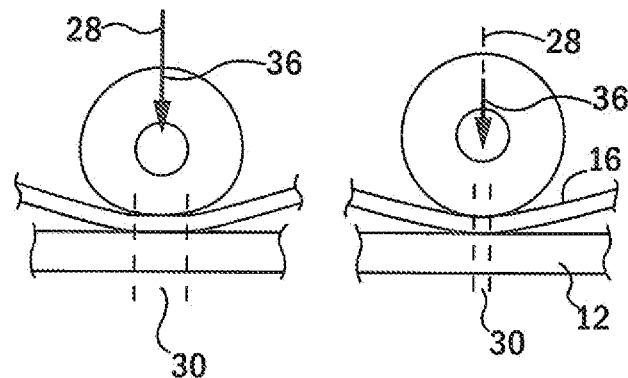
FIG. 3 is a side elevational view of a roller of FIG. 2 for providing the selected deformation of the flexible sheet with the roller under two compressive forces showing control of an effective contact area of the deformation.

Referring now to FIGS. 2 and 3, the deformation roller 26 may, for example, consist of a substantially rigid core coated with a more elastic, smooth polymer material (for example, polydimethylsiloxane, having an RMS roughness less than 0.5 nanometers over a one by one micrometer square area and an elastic modulus of approximately 2 MPa) of an appreciable thickness as compared to the thickness of the flexible sheet (for example, an elastic coating with a thickness on the order of millimeters to centimeters), for example, a thickness of approximately 0.5 centimeters.

Footprint area 30 may be controlled by the length of the deformation roller 26 along its axis of rotation, the applied force 36 along the deformation axis 28, the thickness of the coating on the deformation roller, and the elastic properties of the coating on the deformation roller 26. The relationship between the footprint area 30 and the force 36 is such that increased forces 36 create larger footprint areas 30, and decreased forces 36' reduce the contact width of the footprint area 30. In one embodiment, the dimension of the footprint controlled by the force 36 may vary between less than 100 nanometers and greater than 1 millimeter depending on the material of the roller, the size of the roller, and the applied force.

This footprint area 30 may be selected or controlled to transfer individual rows of nano-patterned elements 10 as positioned on the substrate 12 at one time so that separation of the nano-patterned elements 10 on the flexible sheet 16 may be changed during the transfer process as will be described below. The footprint area 30 may also be selected or controlled together with the force 36 to ensure the necessary adhesion pressures. It will be appreciated that the diameter and elastic modulus of the deformation roller may be adjusted in this regard.

Figure 4:
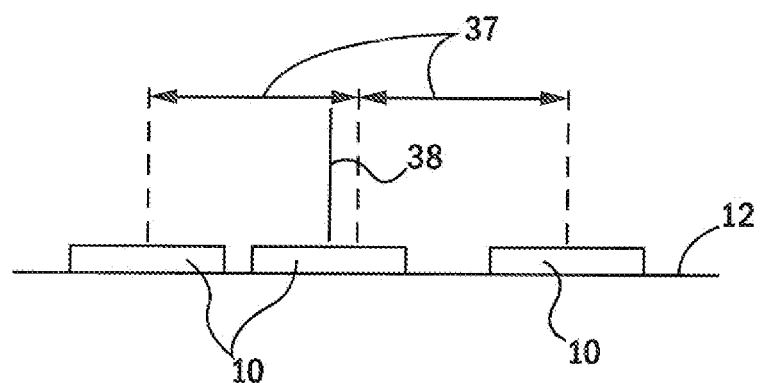
FIG. 4 is a simplified side elevational view of nano-patterned elements on the common substrate shifting in inter-element spacing during the release step of the manufacturing of the nano-patterned elements.

Referring now to FIG. 4, the nano-patterned elements 10 may be fabricated with extremely precise separation 37 on the substrate 12 but may exhibit a shifting 38 when they are released from that substrate 12 prior to transfer. This release may occur, for example, when the nano-patterned elements 10 are separated from a buried oxide layer on which they are fabricated and are momentarily free-floating before attaching again to the substrate 12 via slight cohesive force thereto (van der Waals forces). This shifting may be a significant source of positioning error in the transfer process and, accordingly, the present invention provides several methods of managing the release of the nano-patterned elements 10 from the substrate 12 to eliminate or reduce shifting 38.

Figure 5A:
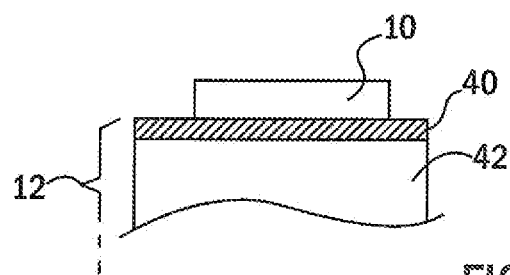
FIGS. 5a-5c are simplified side elevational views of the release of nano-patterned elements in a first embodiment to minimize inter-element shifting for adherence to the common substrate.

Referring now to FIG. 5*a*, in one embodiment, a nano-patterned element 10 may be fabricated from an upper silicon layer of the common substrate 12 over a sacrificial layer 40 (for example, a buried oxide layer of silicon dioxide) positioned over the a base material 42 (typically silicon) of the substrate 12. The upper silicon layer may be treated with optical lithography (e.g. using photoresist and etching), e-beam lithography, nanoimprint lithography (NIL) or other integrated circuit techniques to form the nano-patterned elements 10. The sacrificial layer 40 supporting the form to the nano-patterned elements 10 will then be etched away (for example with hydrofluoric acid) to release the nano-patterned element 10.

Figure 5B:
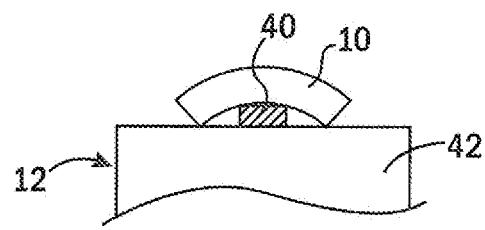
Figure 5C:
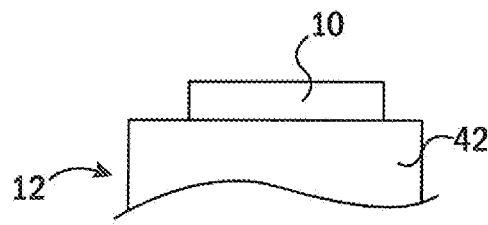

In a first method of managing shifting 38, the relative thickness of the nano-patterned element 10 (as shown in FIG. 5b) and the relative thickness of the sacrificial layer 40 is selected so that when a small portion of the sacrificial layer 40 still connects the nano-patterned element 10 to the base material 42, the nano-patterned element 10 may deflect downward to physically contact the base material 42 and be retained at those contact points when the final portion of the sacrificial layer 40 is removed (as shown in FIG. 5c). The contact shown in FIG. 5b thus stabilizes the location of the nano-patterned element 10 as it settles onto the base material 42. Very thin oxide layers (of less than 100 nanometers) are currently believed to permit this stabilization for thin membrane nano-patterned elements 10.

Figure 6A:
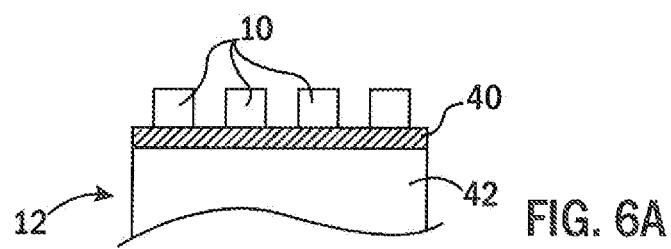
FIGS. 6a-6d are figures similar to that of FIGS. 5a-c showing the use of an interconnecting support matrix to prevent shifting of nano-patterned elements after release until adhered to the common substrate.
Figure 6B:
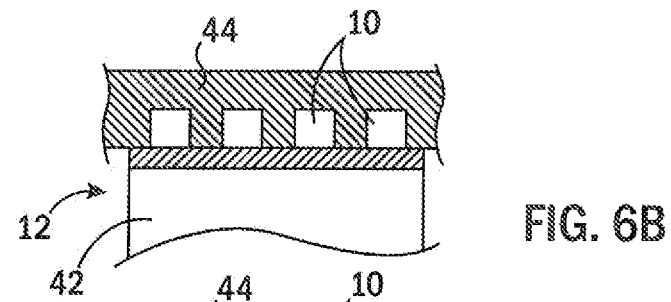

Referring now to FIGS. 6a-6d, in an alternative embodiment, after fabrication of the nanoscale elements 10 on the sacrificial layer 40, an interconnecting matrix 44 may be applied over the top of the nanoscale elements 10 and sacrificial layer 40 (as shown in FIG. 6a). The interconnecting matrix 44 serves to physically preserve the separation of the nanoscale elements 10. In one embodiment, the interconnecting matrix 44 may be a photoresist material as is well understood in the art.

Figure 6C:
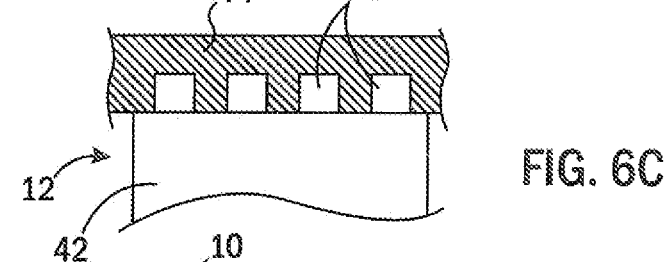
Figure 6D:
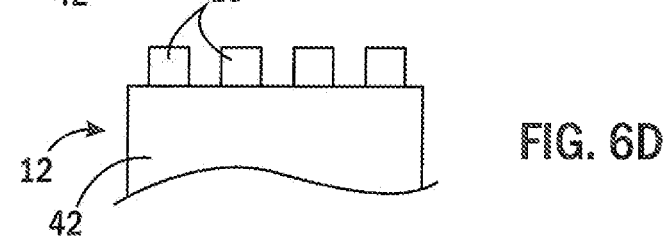

Once the interconnecting matrix 44 is in place, the sacrificial layer 40 may be removed (as shown in FIG. 6c) so that the nano-patterned element 10 descends to abut the upper surface of the base material 42 preserved with their intra-element spacing by the interconnecting matrix 44. The interconnecting matrix 44 may then be removed as shown in FIG. 6d with the nano-patterned elements 10 stabilized by cohesive forces between the base material 42 and the lower surface of the nano-patterned elements 10. In the case where the interconnecting matrix 44 is photoresist, it may be removed by dissolving, for example, using acetone or the like. Other methods of removal of this material or other materials may be employed.

Figure 7:
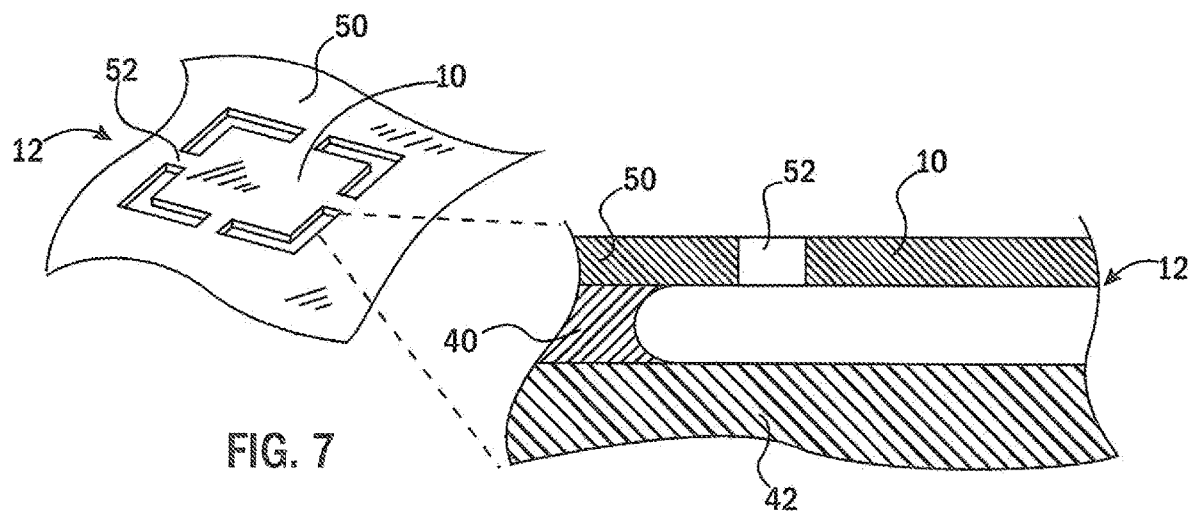
FIG. 7 is a perspective view and fragmentary cross-sectional view of the nano-patterned element retained in position by frangible tabs of silicon material.

Referring now to FIG. 7, in yet another embodiment, each of the nano-patterned elements 10 may be retained by small frangible tabs 52 joining the nano-patterned elements 10 to a remainder of an upper silicon layer 50 of the common substrate 12 from which the nano-patterned elements 10 are formed. The sacrificial layer 40 may be etched away from beneath the nano-patterned elements 10 and the tabs 52 to suspend the nano-patterned elements above the base material 42 but perfectly registered by the tabs 52. Adhesion of the nano-patterned elements 10 to the flexible sheet 16 (for example as shown in FIG. 2) may be sufficient such as to then break the tabs 52 when the flexible sheet 16 draws away from the substrate 12 after passing beneath the deformable roller 26.

Figure 8A:
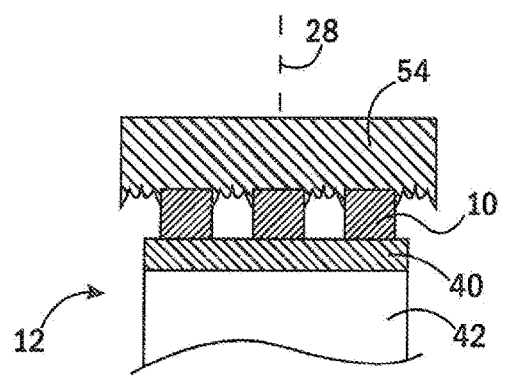
FIGS. 8a-8c are figures similar to FIGS. 5 and 6 showing the use of a conforming stamp material to retain the nano-patterned elements in inter-element spacing after release and before adherence to the common substrate.
Figure 8B:
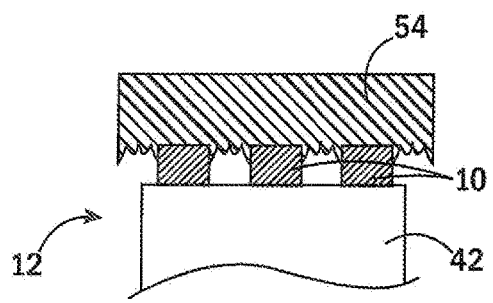
Figure 8C:
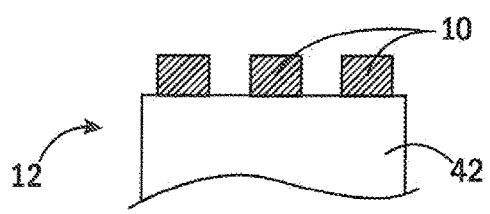

Referring now to FIGS. 8a-8c, in yet another embodiment, after the nano-patterned elements 10 have been fabricated but while they are still supported by the sacrificial layer 40 on the base material 42 of the substrate 12, an elastomeric contact stamp 54 may be pressed downward along deformation axis 28 to contact the nano-patterned elements 10 and hold them in separation by adhesion and partial enveloping as shown in FIG. 8a. In this case, the contact stamp 54 preserves the spacing of the nano-patterned elements 10 as the sacrificial layer 40 is removed as shown in FIG. 8b. The adhesion between the contact stamp 54 and the nano-patterned elements 10 is adjusted to be less than the cohesion between the nano-patterned elements 10 and the base material 42 so that the contact stamp 54 may be removed physically from the nano-patterned elements 10, while the latter are retained cohesively on the base material 42 without substantial shifting.

Figure 9:
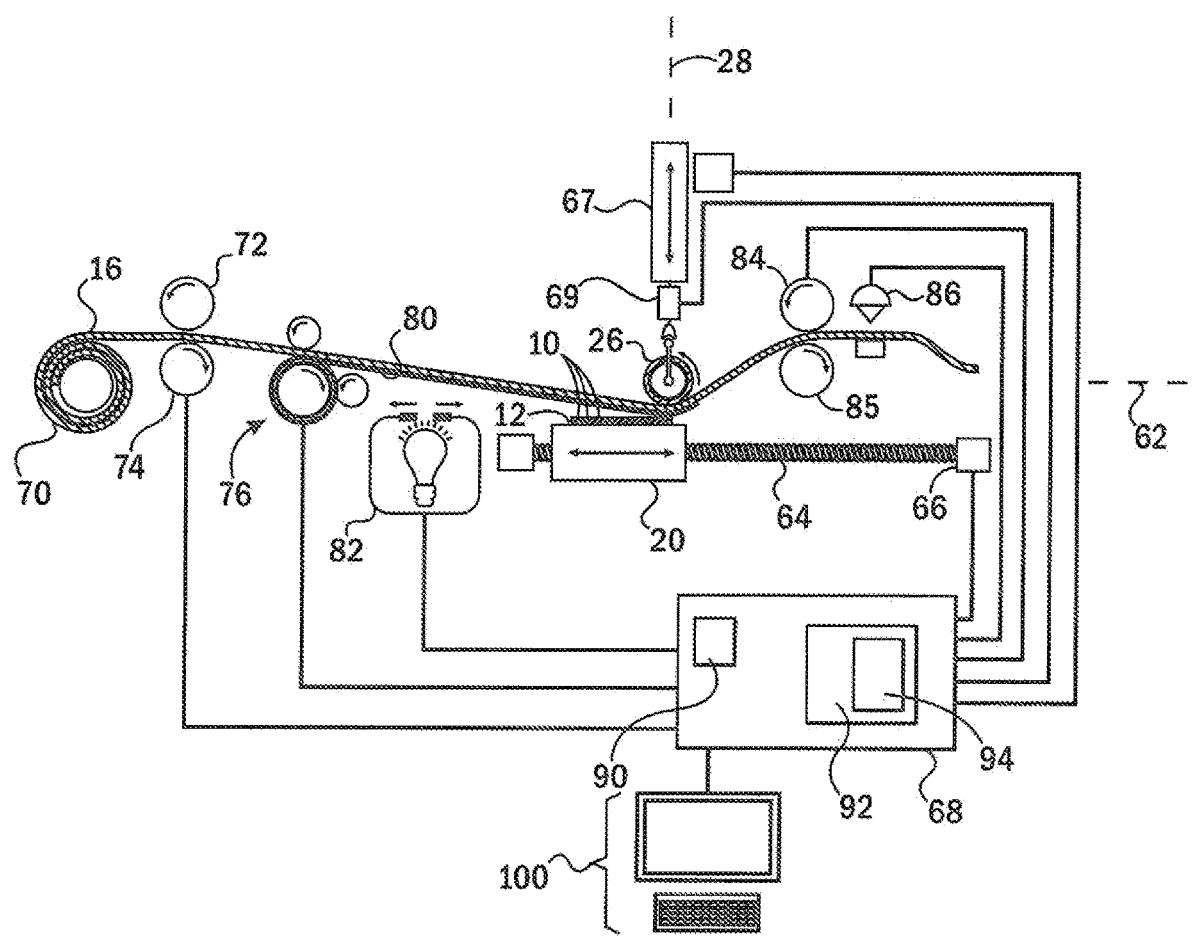
FIG. 9 is a schematic representation of a second embodiment of the apparatus of FIG. 2 providing greater control of the transfer process.

Referring now to FIG. 9, a more sophisticated version of the apparatus of FIG. 2 provides for support of the substrate 12 initially holding the nano-patterned elements 10 on a movable base plate 20, for example, capable of translating along a processing axis 62 generally parallel to an upper surface of the substrate 12 and aligned with the direction of relative movement between the upper surface of the substrate 12 and the deformation roller 26. The movable base plate 20 may, for example, be a platform advanced on a lead screw 64 under control of the servo or stepping motors 66 communicating with a processing controller 68, the latter to be described below.

The deformation roller 26 may be placed on a translation stage 67 monitored by a load cell 69, both also communicating with the controller 68. The position of the stage 67 may be for example, stepper motor-driven or controlled pneumatically. The stage 67 is positioned to allow retraction and advancing of the deformation roller 26 along deformation axis 28 generally normal to the surface of the substrate 12 under control of the controller 68, the latter which may also adjust the force applied to the roller.

A continuous web of flexible sheet 16 may be provided on a spool 70 or the like and retracted from the spool 70 by idler nip 72 and braking nip 74 whose engagement with the flexible sheet 16 and rotation may also be controlled by the controller 68. After passing through the nips 72 and 74, the flexible sheet 16 may pass through an adhesive coater roll assembly 76 applying a thin film of ultraviolet curable adhesive 80 to the under surface of the flexible sheet 16. An example adhesive is Norland Optical Adhesive 75, commercially available from Norland Products, Cranbury N.J.

The coated sheet 16 may then have its adhesive 80 partially cured by an ultraviolet light assembly 82 to control the tackiness of the adhesive 80 by performing a partial cure with a UV exposure (approximately 14 joules per square centimeter dosage, in one embodiment).

The coated flexible sheet 16 may then pass over the substrate 12 with its adhesive facing the substrate 12 to be pressed into contact with the substrate 12 by the deformation roller 26 as described generally with respect to FIG. 2. In one embodiment during this pressing operation, the movable base plate 20 moves at a speed matching movement of the flexible sheet 16 past the deflection roller 26 to selectively expose different portions of the substrate 12 to the deformed flexible sheet 16 to lift the nano-patterned elements 10 from the full width of the substrate 12. It will be understood that the matching movement of the base plate 20 and flexible sheet 16 provides fidelity in the pattern of the nanoscale elements 10 as transferred to the flexible sheet 16 with respect to orientation and separation.

Alternately, the speed of the base plate 20 may be varied with respect to the flexible sheet 16 to allow a change in the spacing of the nanoscale elements 10 with respect to their spacing on the flexible sheet 16.

Upon completion of the transfer of the nanoscale elements 10 from the substrate 12, the deformation roller 26 may be raised and the base plate 20 may move away from the roller 26 for a new substrate 12 to be installed thereon and this process repeated.

After the flexible sheet 16 has received nanoscale elements 10, it is received by corresponding downstream idler nip 84 and driven nip 84 and may pass, for example, through a web cutter 86 which may cut the flexible sheet 16 into desired lengths. Control of the braking nip 74 and the driven nip 84 may control the tension of the sheet 16 either open loop or according to a tension sensor (not shown) of the type well known in the art. A tension of 170 kilopascals may be used.

Alternatively, the flexible sheet 16 maybe a spool in a second roll (not shown) or be used for subsequent transfer of the nanoscale pattern elements 10 to yet a different substrate or another roll in a roll-to-roll transfer.

The sequencing and standard feedback control of the elements described herein may thus be under control of the controller 68 providing a processor 90 communicating with internal memory 92 holding a stored program 94. Controller 68 may receive control input instructions from a user through standard terminal interface 100 and may protect feedback signals for proper registration and timing of the various elements to affect the control described above. In particular, the controller 68 may control translations speed and tension of the sheet 16, contact force of the deformation roller 26, thickness of the adhesive coating, and relative movement of the base plate 20.

It will be appreciated that other deforming elements may be used in lieu of a roller to provide, for example, a more compact footprint area, for example in the shape of a cone, wedge, or sphere movable in two dimensions over the surface of the substrate for greater selectivity.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor," can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

What we claim is:

1. An apparatus for transferring nano-patterned elements to a flexible substrate comprising:
at least one substrate having nano-patterned elements regularly spaced along an axis and supported on an upper planar surface of the at least one substrate, each nano-patterned element having an exposed upper surface having a width extending along the axis;
a support adapted to hold the at least one substrate;
a flexible sheet providing an adhesive surface attached to and exposed on a lower surface of the flexible sheet toward the at least one substrate and adapted to adhere to the nano-patterned elements to remove the nano-patterned elements from the at least one substrate and to hold the nano-patterned elements against the flexible sheet after removal wherein the flexible sheet is dimensionally stable within a plane of the flexible sheet at a scale of the nano-patterned elements;
guide elements for positioning the flexible sheet in planar tension overlaying the at least one substrate having the nano-patterned elements and for placing the flexible sheet in contact with the nano-patterned elements to separate them from the at least one substrate;
a platen positionable against an upper surface of the flexible sheet to (a) controllably locally deform the flexible sheet into close contact with a first subset of the nano-patterned elements to cause adhesion thereto, the platen providing a flattened surface when pressing on the flexible sheet against the at least one substrate, the flattened surface controlling a footprint of contact between the flexible sheet and the first subset of the nano-patterned element, the platen and guide elements cooperating to (b) controllably change a location of the deformation of the flexible sheet to lift the first subset of nano-patterned elements from the at least one substrate and to repeat steps (a) and (b) with different subsets of the nano-patterned elements;
an actuator adapted to apply an actuator force in a direction perpendicular to the flattened surface of the platen toward the nano-patterned elements to press the flattened surface into the flexible sheet without substantial stretching of the flexible sheet along a direction between the guide elements and to further present the footprint of the flexible sheet pressed into contact with the exposed upper surface of the subset of nano-patterned elements;
a force sensor measuring a contact force applied to the subset of nano-patterned elements; and
a controller providing a signal to the actuator in response to the force sensor to control the contact force applied to the subset of nano-patterned elements;
wherein the contact force is selected to cause the flattened surface of the platen to press against the flexible sheet whereby the footprint contacts an entire width of the exposed upper surface of the subset of nano-patterned elements before removing contact of the flexible sheet from the exposed upper surface of the at least one substrate.

2. The apparatus of claim 1 further including a second actuator controlling the positioning of the guide elements, a tension sensor measuring a tension of the flexible sheet between the guide elements, and a controller providing a signal to the second actuator in response to the tension sensor to control the tension of the flexible sheet between the guide elements.

3. The apparatus of claim 1 wherein the controller further receives control input instructions from a user to control at least one of the contact force and the guide elements to provide a predetermined tension of the flexible sheet.

4. The apparatus of claim 1 wherein the platen is of a form of one of a roller, cone, wedge, and sphere.

5. The apparatus of claim 1 wherein the platen has a rigid core coated with an elastic polymer material that controllably flattens under the actuator force of the actuator.

6. The apparatus of claim 1 wherein the platen is thicker than the flexible sheet.

7. The apparatus of claim 1 wherein the platen is movable in a first direction substantially perpendicular to the surface of the at least one substrate and in a second direction substantially parallel to the surface of the at least one substrate.

8. The apparatus of claim 1 further comprising a translation stage supporting the platen and providing approach and retraction of the platen along an axis substantially normal to the surface of the at least one substrate.

9. The apparatus of claim 1 wherein the support includes a movable base plate configured to move along a first axis substantially parallel to an upper surface of the at least one substrate.

10. The apparatus of claim 9 wherein movement of the movable base plate is further aligned with a direction of relative movement between the upper surface of the at least one substrate and the platen.

11. The apparatus of claim 1 wherein the flexible sheet has a surface area greater than a surface area of an individual substrate for receiving nano-patterned elements from more than one substrate.

12. The apparatus of claim 1 wherein the controller further communicates with at least one motor controlling a relative translation speed of the flexible sheet and support to adjust a spacing of the nano-patterned elements on the flexible sheet.

13. The apparatus of claim 1 further including the at least one substrate having nano-patterned elements removably attached to the substrate to retain the nano-patterned elements in registration on the substrate prior to contact with the flexible sheet and to release the nano-patterned elements when the flexible sheet lifts the nano-patterned elements from the substrate.

14. The apparatus of claim 1 wherein the nano-patterned elements are attached to the at least one substrate with a breakable tab and wherein the adhesive surface attached to and exposed at the lower surface of the flexible sheet toward the at least one substrate is further adapted to release the nano-patterned elements by breaking the breakable tab.

15. The apparatus of claim 1 further including a lamp controlling a tackiness of the adhesive surface and positioned before the platen to treat the adhesive surface on the flexible sheet before the flexible sheet is deformed into contract with the nano-patterned elements.

16. An apparatus for transferring nano-patterned elements to a flexible substrate comprising:
at least one substrate having nano-patterned elements regularly spaced along an axis and supported on an upper planar surface of the at least one substrate, each nano-patterned element having an exposed upper surface having a width extending along the axis;
a support adapted to hold the at least one substrate;
guide elements for positioning a flexible sheet in planar tension overlaying the at least one substrate having the nano-patterned elements and for placing the flexible sheet in contact with the nano-patterned elements to separate them from the at least one substrate wherein the flexible sheet is dimensionally stable within a plane of the flexible sheet at a scale of the nano-patterned elements;
a platen positionable against an upper surface of the flexible sheet to: (a) controllably locally deform the flexible sheet into close contact with a first subset of the nano-patterned elements to cause adhesion thereto, the platen providing a flattened surface when pressing on the flexible sheet against the at least one substrate, the flattened surface controlling a footprint of contact between the flexible sheet and the first subset of the nano-patterned elements, the platen and guide elements cooperating to (b) controllably change a location of the deformation of the flexible sheet to lift the first subset of nano-patterned elements from the at least one substrate and to repeat steps (a) and (b) with different subsets of the nano-patterned elements;
an actuator adapted to apply an actuator force in a direction perpendicular to the flattened surface of the platen toward the nano-patterned elements to press the flattened surface into the flexible sheet without substantial stretching of the flexible sheet along a direction between the guide elements and to further present the footprint of the flexible sheet pressed into contact with the exposed upper surface of the subset of nano-patterned elements;
a force sensor measuring a contact force applied to the subset of nano-patterned elements; and
a controller providing a signal to the actuator in response to the force sensor to control the contact force applied to the subset of nano-patterned elements;
wherein the controller further receives control input instructions from a user to control at least one of the contact force and the guide elements to provide a predetermined tension of the flexible sheet;
wherein the controller further communicates with at least one motor controlling a relative translation speed of the flexible sheet and support, and with at least one force sensor controlling the contact force applied to the nano-patterned elements to change an area of contact, to change a spacing between the nano-patterned elements on the at least one substrate with respect to a spacing of the nano-patterned elements on the flexible sheet;
wherein the contact force is selected to cause the flattened surface of the platen to press against the flexible sheet whereby the footprint contacts an entire width of the exposed upper surface of the subset of nano-patterned elements before removing contact of the flexible sheet from the exposed upper surface of the at least one substrate.

17. The apparatus of claim 1 wherein the platen is movable in two directions along the surface of the at least one substrate.

18. A method of generating large-scale arrays of nano-patterned elements comprising the steps of:
(a) providing an apparatus comprising
at least one substrate having nano-patterned elements regularly spaced along an axis and supported on an upper planar surface of the at least one substrate, each nano-patterned element having an exposed upper surface having a width extending along the axis;

a support adapted to hold the at least one substrate;

a flexible sheet providing an adhesive surface attached to and exposed on a lower surface of the flexible sheet toward the at least one substrate and adapted to adhere to the nano-patterned elements to remove the nano-patterned elements from the at least one substrate and to hold the nano-patterned elements against the flexible sheet after removal wherein the flexible sheet is dimensionally stable within a plane of the flexible sheet at a scale of the nano-patterned elements;

guide elements for positioning the flexible sheet in planar tension overlaying the at least one substrate having the nano-patterned elements to be placed in contact with the nano-patterned elements to separate the nano-patterned elements from at least one substrate;

a platen positionable against an upper surface of the flexible sheet to (i) controllably locally deform the flexible sheet into close contact with a first subset of the nano-patterned elements to cause adhesion thereto, the platen providing a flattened surface when pressing on the flexible sheet against the at least one substrate, the flattened surface controlling a footprint of contact between the flexible sheet and the first subset of the nano-patterned element, the platen and guide elements cooperating to (ii) controllably change a location of the deformation of the flexible sheet to lift the first subset of nano-patterned elements from the at least one substrate and to repeat steps (i) and (ii) with different subsets of the nano-patterned elements;

an actuator adapted to apply an actuator force in a direction perpendicular to the flattened surface of the platen toward the nano-patterned elements to press the flattened surface into the flexible sheet without substantial stretching of the flexible sheet along a direction between the guide elements and to further present the footprint of the flexible sheet pressed into contact with the exposed upper surface of the subset of nano-patterned elements;

a force sensor measuring a contact force applied to the nano-patterned elements; and a controller providing a signal to the actuator in response to the force sensor to control the contact force applied to the nano-patterned elements;

(b) receiving the at least one substrate with the nano-patterned elements on the surface of the at least one substrate;

(c) overlaying the at least one substrate and the nano-patterned elements with the flexible sheet;

(d) locally deforming the flexible sheet into intimate contact with the first subset of the nano-patterned elements to cause preferential adhesion thereto in the area of the contact to cause the flattened surface of the platen to press against the flexible sheet whereby the footprint contacts an entire width of the exposed upper surface of the subset of nano-patterned elements before removing contact of the flexible sheet from the exposed upper surface of the at least one;

(e) changing the location of the deformation of the flexible sheet with respect to the at least one substrate to lift the first subset of nano-patterned elements from the at least one substrate and to deform the flexible sheet into close contact with a different second subset of nano-patterned elements to cause preferential adhesion thereto in the area of contact; and (f) repeating steps (d) and (e) with different subsets of the nano-patterned elements.

19. The method of claim 18 further comprising the step of:

applying the actuator force in a direction perpendicular to the surface of the at least one substrate toward the nano-patterned elements;

measuring the force applied to the nano-patterned elements; and applying the contact force in response to the measured force to cause the contact sheet to contact the subset of nano-patterned elements without contacting nano-patterned elements adjacent to the subset of nano-patterned elements.

\* \* \* \* \*